（12） United States Patent
Autry et al.

(10) Patent No.: US 7,741,706 B2
(45) Date of Patent: Jun. 22, 2010

(54) PLASTIC SURFACE MOUNT LARGE AREA POWER DEVICE

(75) Inventors: Tracy Autry, Trabuco Canyon, CA (US); Stephen G. Kelly, Melrose, MA (US); George A. Digiacomo, Phoenix, AZ (US); Christopher Alan Barnes, Arvada, CO (US)

(73) Assignee: Microsemi Corporation, Irving, CA (US)

( * ) Notice: Subject to any disclaimer, the term of this patent is extended or adjusted under 35 U.S.C. 154(b) by 162 days.

(21) Appl. No.: 11/542,090

(22) Filed: Sep. 29, 2006

(65) Prior Publication Data

US 2008/0079126 A1    Apr. 3, 2008

(51) Int. Cl.
*H01L 23/495* (2006.01)
(52) U.S. Cl. .................. 257/675; 257/459; 257/503; 257/706; 257/707; 257/E23.02; 257/E23.031; 257/E23.04; 257/E21.505; 438/122
(58) Field of Classification Search ........... 257/675, 257/706, 717, E23.105, E21.505, 777, 459, 257/503, E23.02, E23.031, E23.04; 438/122, 438/FOR. 413
See application file for complete search history.

(56) References Cited

U.S. PATENT DOCUMENTS

| 5,067,005 | A | * | 11/1991 | Michii et al. ................ 257/700 |
| 5,747,877 | A | | 5/1998 | Wilson |
| 6,410,356 | B1 | * | 6/2002 | Wojnarowski et al. ........ 438/15 |

FOREIGN PATENT DOCUMENTS

| DE | 101 46 854 A1 | 4/2003 |
| EP | 0 554 893 A | 8/1993 |
| FR | 2 668 854 A | 5/1992 |

OTHER PUBLICATIONS

Int'l Search Report/ and Written Opinion, Apr. 25, 2008, Autry, et al.

* cited by examiner

*Primary Examiner*—Long K Tran
(74) *Attorney, Agent, or Firm*—Robert C. Kling

(57) ABSTRACT

A low profile, 1 or 2 die design, surface mount high power microelectronic package with coefficient of expansion (CTE) matched materials such as Silicon die to Molybdenum conductor (bond pads). The CTE matching of the materials in the package enables the device to withstand repeated, extreme temperature range cycling without failing or cracking. The package can be used for transient voltage suppression (TVS), Schottky diode, rectifier diode, or high voltage diodes, among other uses. The use of a heat sink metal conductor that has a very high modulus of elasticity allows for a very thin wall plastic locking to be utilized in order to minimize the footprint of the package.

18 Claims, 2 Drawing Sheets

PLASTIC SURFACE MOUNT LARGE AREA POWER DEVICE

FIELD OF THE INVENTION

The present invention generally related to microelectronic packages, and more specifically to surface mount packages.

BACKGROUND OF THE INVENTION

High power microelectronic package devices can be used as rectifiers or switches in power circuits with large power requirements. In order to design a device capable of handling the large power requirements, the process of stacking many (6-8) die on top of each other within a single package was employed. This die-stacking method increases the chances of visual or electrical failure and makes it more difficult to hit a targeted voltage device. Drawbacks of stacked-die devices are that the package profiles are significantly increased, and lower voltage devices cannot be achieved due to the multiple stack die. Also, the stacked-die device cannot be heatsinked to the board for rectifier or load dump applications. Extreme temperature cycling results in device failure or cracking.

High power devices are typically mounted on a Printed Circuit Board (PCB) using conventional through-hole techniques which make the board assembly costly and slow the assembly process. This approach leaves a large footprint on the PCB and precludes devices from being supplied in Tape and-Reel format.

There is desired improved high power devices with a single die to handle high power requirements without multiple stacks in a low profile, surface mount package.

SUMMARY OF INVENTION

The present invention achieves technical advantages as a surface mount high power microelectronic package. One exemplary embodiment of the invention utilizes a low profile, single die design package with coefficient of expansion (CTE) matched materials such as Silicon die to Molybdenum conductors (bond pads). The CTE matching of the materials in the package enables the device to withstand repeated, extreme temperature range cycling without failing or cracking. The package can be used for transient voltage suppression (TVS), Schottky diode, rectifier diode, or high voltage diodes, among other uses. The use of a heat sink metal conductor that has a very high modulus of elasticity allows for a very thin wall plastic locking to be utilized in order to minimize the footprint of the package.

DETAILED DESCRIPTION OF THE PRESENT INVENTION

Figure 1:
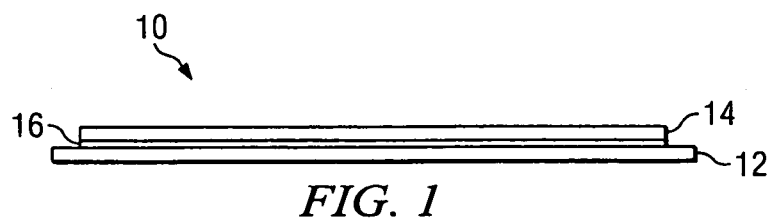
FIG. 1 is a side view of a sub assembly of an exemplary embodiment of the microelectronic package.

Referring to FIG. 1, there is shown at 10 a sub assembly of the surface mount high power microelectronic package. For ease of manufacturability the device is constructed in steps to help avoid misalignment. The sub assembly is constructed, other components are added, and everything encapsulated by the packaging. A large area semiconductor die is disposed to a conductor (bond pad) with attaching material, wherein the CTE of the semiconductor die matches the CTE of the bond pad. In one exemplary embodiment, a silicon die 12 having a large area, such as 0.380"×0.380", is disposed to a molybdenum ("moly") pad, with a thickness of roughly 0.010", with soft solder 16. The "moly" pad 14 is similar in size to the silicon die 12 being used. A high temperature solder such as 95Pb/5Sn, with a melting point around 309° C. is used to construct the subassembly in a controlled atmosphere belt furnace with out the use of flux. The "moly" pad 14 helps to prevent flexing due to heat and therefore mitigates the potential damage to the device. The thermal expansion of the die dictates all of the other materials used in the construction of the device. Choice and combination of material properties relative to the semiconductor die make it possible to make a large area device with minimal footprint with high reliability.

Figure 2:
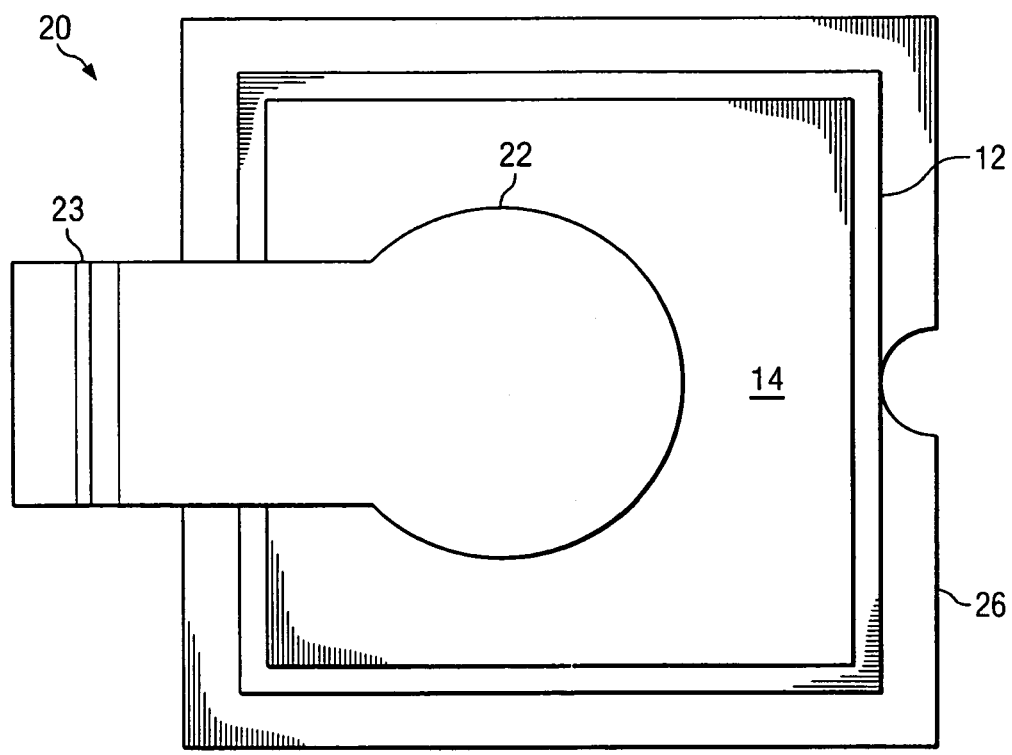
FIG. 2 is a top view of the exemplary embodiment of the present invention prior to molding.

Referring now to FIG. 2, there is shown at 20 a top view of the exemplary embodiment of the present invention prior to molding. A high electrical conductivity copper tab 22 is operably coupled to the "moly" pad 14, which is operably coupled to the silicon die 12, which is operably coupled to an 85Mo/15Cu metal matrix heatsink 26 using a solder with a slightly lower melting point than the one used in the subassembly construction. The construction can be achieved by disposing the elements at the same time in a controlled atmosphere belt furnace with 88PB/10Sn/2Ag solder with a softening/melting range around 280° C. The heatsink 26 has a very high modulus of elasticity and a thermal expansion similar to the CTE of the die. Advantageously, in addition to heat dissipation, the heatsink 26 material serves as a mounting structure for securing the device to the board while providing a very rigid structure that does not flex. The heatsink 26 material is comprised of a copper/"moly" matrix, but could be comprised of a copper/tungsten matrix, copper/molybdenum matrix, or other materials. The copper tab 22 has a bend 23 which allows planar attachment of the package to the substrate.

Figure 3:
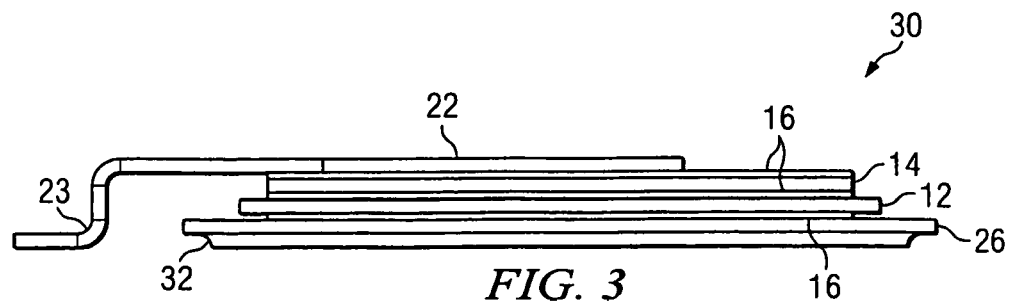
FIG. 3 is a side view of the exemplary embodiment of the present invention prior to molding.

Referring now to FIG. 3, there is shown at 30 a side view of the exemplary embodiment of the present invention prior to molding. The silicon die 12 is mounted with the cathode side coupled to the heatsink 26 because the thermal expansion of the heat sink is similar to that of the silicon die 12. However, to increase reliability, a second "moly" pad 14 can be disposed between the silicon die 12 and the heatsink 26. When over molded with a material such as transfer molding compound, prevents cracking in the mold compound during thermal cycling in the area around the integral locking mechanism in the heatsink. This allows for a very thin walled plastic molded part with minimal footprint on the board. The heatsink 26 is configured with an integral half etch locking mechanism 32 around the perimeter of the heatsink 26 to ensure the plastic mold is firmly affixed to the heatsink 26. Any locking technique affixing the plastic mold to the heatsink 26 can be used.

Figure 4:
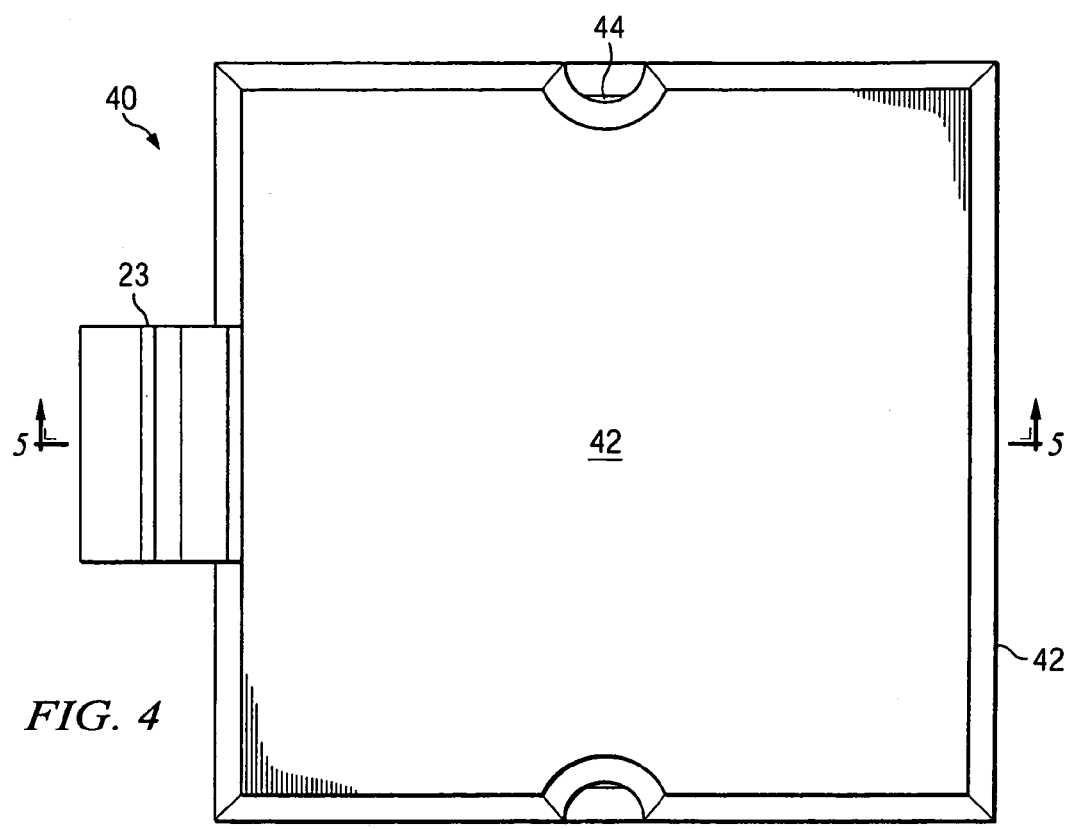
FIG. 4 is a top view of the exemplary embodiment of the present invention.

Referring now to FIG. 4, there is shown at 40 a top view of the exemplary embodiment of the present invention assembly after molding. The device is packaged with a thin plastic mold 42 which minimizes the footprint. The plastic mold 42 has a hole 44 which prevents the mold compound from insulating the internal contact points (flashing) the device.

Figure 5:
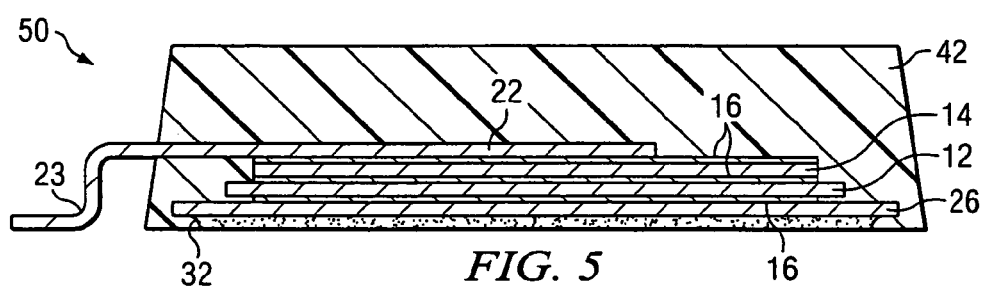
FIG. 5 is a cross-sectional view of the exemplary embodiment of the present invention taken along A-A of FIG. 4.

Referring now to FIG. 5, there is shown at 50 a cross-sectional view of the exemplary embodiment of the present invention taken along A-A of FIG. 4. The copper tab 22, "moly" pad 14, silicon die 12, and the heatsink 26, are over molded with molding compound in a transfer mold leaving the device with a low profile and small footprint. over molded with molding compound in a transfer mold. A typical molding compound could be Sumitomo 6300H and post mold cured per the molding compound manufacture's recommendation.

All exemplary embodiments of the invention can be configured as a Transient Voltage Suppressor (TVS), which is a clamping device that limits voltage spikes by low impedance avalanche breakdown of a rugged silicon PN junction. TVSs can be used to protect sensitive components from electrical overstress such as that caused by induced lightning, inductive load switching, and electrostatic discharge.

To employ the present invention, determine the power requirement for the application. For example if a 15 kW bi-directional TVS is required, then one device is sufficient for the application. If a 45 kW TVS is required, then 3 devices are required, etc. Determine the voltage of the device needed. For each device to be put on an electronic board (such as a PCB) the bonding pad for the device should be laid out per the suggested bonding on the device's data sheet. The device(s) can be placed manually or by automated assembly equipment onto the bonding pad and soldered using industry standard solder reflow techniques, such as convection reflow.

Figure 6:
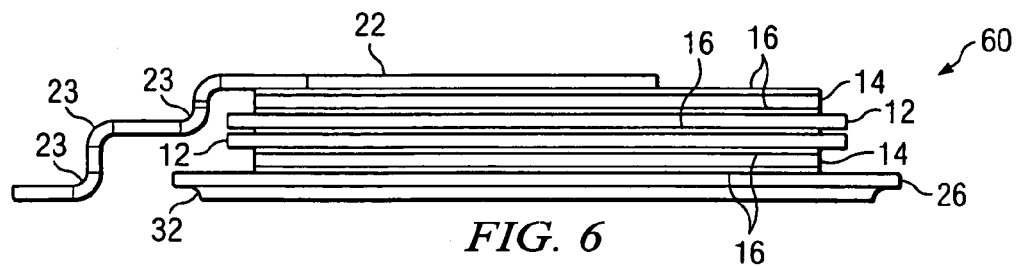
FIG. 6 is a side view of a second exemplary embodiment of the present invention prior to molding.

Referring now to FIG. 6, there is shown at 60 a side view of a second exemplary embodiment of the present invention prior to molding. Two semiconductor die 14 are disposed so that the cathodes of the PN junctions are operably coupled. Each 0.380"×0.380" semiconductor die has a 15 kW rated TVS surge protection. Due to the fact that the semiconductor die 14 are coupled cathode to cathode, the 15 kW rated surge protection is bi-directional.

Figure 7:
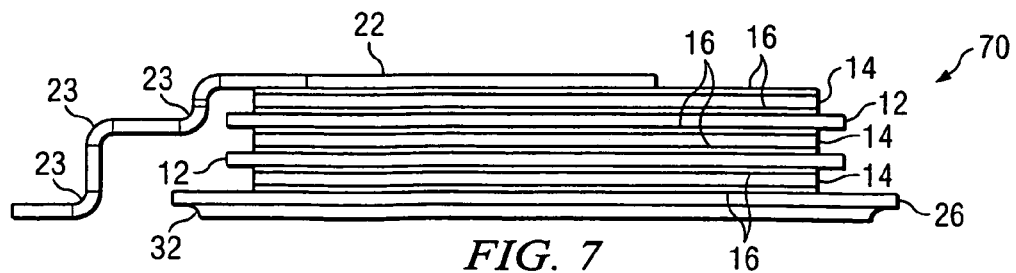
FIG. 7 is a side view of a third exemplary embodiment of the present invention prior to molding.

Referring now to FIG. 7, there is shown at 70 a side view of a second exemplary embodiment of the present invention prior to molding. Due to the fact that in this configuration, the semiconductor die 14 are disposed cathode to anode, a "molly" pad is required so that the PN junction components do not short circuit. The 0.380"×0.380", 15 kW rated, semiconductor die TVS surge protection is then aggregated to have a power protection rating of 30 kW bi-directionally.

The present invention realizes technical advantages because first, the single large die can handle high power requirements without many stacked die. Secondly, because of the surface mount packaging, the device can be supplied in Tape-and-Reel format, and can be placed on the board using standard automated assembly equipment (i.e. Pick and Place). Thirdly, the device can be heatsinked to the PCB for rectifier/Schottky and load dump applications.

The present invention further realizes technical advantages by matching the thermal expansion of the materials in package so large die can be used which allow the ability to perform military (Hi-Rel) temperature cycling.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A device for high power applications, comprising: a first large area semiconductor die having a top surface and a bottom surface;
   a first conductive pad having a coefficient of thermal expansion matched to and similar in size to the first large area semiconductor die, and disposed upon the first large area semiconductor die top surface;
   an electrically conductive planar tab disposed upon the first conductive pad; and
   a thin key mold encapsulating the first semiconductor die, the tab, and the first conductive pad, the device packaged as a surface mount device.

2. The device as specified in claim 1 further comprising a heatsink having a coefficient of thermal expansion matched to and disposed proximate the bottom surface of the first semiconductor die.

3. The device as specified in claim 2 further comprising a third conductive pad having a coefficient of thermal expansion matched to and disposed between the first semiconductor die bottom surface and the heatsink.

4. The device as specified in claim 1, wherein the first conductive pad is comprised of molybdenum.

5. The device as specified in claim 1, wherein the tab is comprised of cooper.

6. The device as specified in claim 1, wherein the device is a Transient Voltage Suppressor.

7. The device as specified in claim 1, wherein the device is a Schottky diode.

8. The device as specified in claim 1, wherein the device is a rectifier diode.

9. The device as specified in claim 1 further comprising a second large area semiconductor die having a top surface and a bottom surface, the second semiconductor die top surface coupled to the bottom surface of the first semiconductor die.

10. The device as specified in claim 9 wherein the first semiconductor die and the second semiconductor die are electrically configured in series.

11. The device as specified in claim 9 further comprising a second conductive pad having a coefficient of thermal expansion matched to and disposed between the first semiconductor die and the second semiconductor die.

12. The device as specified in claim 11 wherein the second conductive pad is similar in size to the first semiconductor die.

13. The device as specified in claim 9 further comprising a heatsink having a coefficient of thermal expansion matched to and disposed proximate the bottom surface of the second semiconductor die.

14. The device as specified in claim 13 further comprising a third conductive pad having a coefficient of thermal expansion matched to and disposed between the second semiconductor die and the heatsink.

15. The device as specified in claim 14 wherein the third conductive pad is similar size as to the second semiconductor die.

16. The device as specified in claim 9, wherein both the first semiconductor die and the second semiconductor die are the same type of die.

17. The device as specified in claim 9, wherein both the first semiconductor die and the second semiconductor die are diodes.

18. The device as specified in claim 9 wherein the second semiconductor die is similar in size to the first semiconductor die.

* * * * *